(12) United States Patent
Malgioglio et al.

(10) Patent No.: US 8,010,922 B2
(45) Date of Patent: Aug. 30, 2011

(54) AUTOMATED METHOD FOR BUFFERING IN A VLSI DESIGN

(75) Inventors: Frank Malgioglio, Hopewell Junction, NY (US); Adam R. Jatkowski, Wyoming, PA (US); Brian A. Lasseter, Austin, TX (US); Joseph J. Palumbo, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 764 days.

(21) Appl. No.: 12/032,762

(22) Filed: Feb. 18, 2008

(65) Prior Publication Data

US 2009/0210842 A1     Aug. 20, 2009

(51) Int. Cl.
*G06F 17/50* (2006.01)
(52) U.S. Cl. ........................................ 716/114; 716/113
(58) Field of Classification Search .................. None
See application file for complete search history.

(56) References Cited

U.S. PATENT DOCUMENTS

| | | | |
|---|---|---|---|
| 5,475,607 A | 12/1995 | Apte | |
| 6,044,209 A | 3/2000 | Alpert | |
| 6,295,636 B1 | 9/2001 | Dupenloup | |
| 6,480,987 B1 * | 11/2002 | McBride | 716/113 |
| 6,493,854 B1 | 12/2002 | Chowdhury | |
| 6,629,298 B1 * | 9/2003 | Camporese et al. | 716/113 |
| 6,662,349 B2 * | 12/2003 | Morgan et al. | 716/114 |
| 6,718,531 B2 * | 4/2004 | Katayose | 716/114 |
| 6,910,200 B1 | 6/2005 | Aubel | |
| 6,996,512 B2 * | 2/2006 | Alpert et al. | 703/14 |
| 7,024,652 B1 * | 4/2006 | McGaughy et al. | 716/115 |
| 7,103,863 B2 * | 9/2006 | Riepe et al. | 716/113 |
| 7,127,696 B2 | 10/2006 | Alpert | |
| 7,181,383 B1 * | 2/2007 | McGaughy et al. | 703/14 |
| 7,454,730 B1 * | 11/2008 | Chowdhury | 716/114 |

* cited by examiner

*Primary Examiner* — Leigh Marie Garbowski
(74) *Attorney, Agent, or Firm* — William A. Kinnaman, Jr.

(57) ABSTRACT

Buffers are placed on selected nets coupled to input and output pins of entities in an IC device. This includes loading selected input and output pins of entities prior to respectively buffering nets of the entities and buffering in successive iterations, which includes setting artificial loads on selected input pins. The buffering in a current iteration is limited to i) buffering nets on the current iteration entity for receivers on the current iteration entity and ii) buffering nets on the current iteration entity directly coupled to respective nets of an immediately adjacent entity that has been buffered already in a preceding one of iterations, but only if the already buffered net is coupled to a receiver on its own net or a receiver on some other already buffered net via nets that have all been buffered via one or more of the preceding iterations.

20 Claims, 9 Drawing Sheets

AUTOMATED METHOD FOR BUFFERING IN A VLSI DESIGN

TRADEMARKS

IBM® is a registered trademark of International Business Machines Corporation, Armonk, N.Y., U.S.A. Other names used hereon may be registered trademarks, trademarks or product names of International Business Machines Corporation or other companies.

BACKGROUND OF THE INVENTION

1. Field of the Invention

This invention relates to VLSI designs, and is particularly applicable to, although not necessarily limited to, signal buffering for signals that pass up and/or down through a concurrent hierarchy.

2. Description of Background

Buffer programs in hierarchical VLSI designs select locations for placing buffers wired in series between respective driving and receiver circuits. (The terms "buffer" and "repeater" herein are interchangeable.) Typically, such a buffer program does not take into account information beyond the bounds of a particular hierarchical level it is working on. Consequently, the buffer program can produce sub-optimal buffer placement solutions for buffers that cross boundaries of the hierarchical level. Examples of sub-optimal solutions include both too many buffers and not enough buffers between a driving and receiving circuit. The case of too many buffers occurs when the combined result of buffer programs executing in different levels of hierarchy introduces too many buffers, thus impacting slack. The case of not enough buffers occurs when the combined result of buffer programs executing in different levels of hierarchy docs not introduce sufficient buffering, impacting slew and possibly slack.

Solutions to this problem conventionally involve communication in which entities pass load values, which are typically capacitative load values, from adjacent levels of hierarchy to their neighbors) in either a tops-down or bottoms-up fashion, meaning that load values are passed down or up (i.e., always one way or the other, but not both) through the design hierarchy. For example, in an up-passing arrangement, load values may be passed from a macro entity up to a unit entity and from the unit entity up to a chip entity, which may be designated as a parent entity. Up-passing of load information has been common. This is partly because macros, being more primitive than units, tend to get done earlier in the design than units, and units tend to get done earlier than the chip. Another reason that load values are commonly passed upward is that timing tools often are used for this communication and they tend to analyze timing in a bottoms-up fashion. Einstimer is an IBM tool used for delay-based timing. TLT is an IBM tool used to create timing rules, which are used as input for Einstimer, for primitive macros or even units.

Stated another way, in hierarchical chip design, a lot of tasks occur concurrently on respective entities of the chip. To work on a variety of parts, i.e., entities, of the chip in parallel, there must be some predetermined rules about timing boundaries among entities and there must be communication among entities. It sometimes happens that when all the entities come together there is insufficient communication or there are ill conceived rules, resulting in had repeater spacing across the hierarchical boundaries, i.e., repeaters either placed too close to one another or too far apart.

The use of tinting tools to communicate load values from one entity to another gives rise to another issue besides the issue of suboptimal buffer spacing that arises from one-way communication. That is, timing tools generally take a long time to execute timing runs, since they take into account much detail and they run many different tests. For a large chip design, a timing analysis run by a conventional timing tool may take several days.

SUMMARY OF THE INVENTION

The present invention involves a recognition that problems associated with solely tops-down or solely bottoms-up buffer placement arise at least partly because a driving receiving circuits may tend to compete for optimal buffer placement.

The shortcomings of the prior art axe overcome and additional advantages are provided in which buffer parameter selection is improved for a driving circuit and an associated receiver circuit in non-adjacent levels of design hierarchy by propagating load values backwards from the receiving circuit to the driving circuit, which may be up and down through however many hierarchical levels separate the driver circuit and receiver circuit, regardless of respective levels of the driving and receiving circuits in the design hierarchy. As used herein, the term "buffer parameter" includes buffer circuit strength, which is a function of transistor gate width, and buffer placement, which includes both location and number of buffers in series within predetermined physical boundaries in a network.

In another feature, the buffer parameter selection process selects buffer parameters for a first driver and its respective receiver or receivers in parallel with selecting buffer parameters for a second driver and its respective receiver or receivers, in parallel with selecting buffer parameters for a third driver, etc.

In another feature of the present invention, buffer parameters are automatically selected by a process responsive to a more limited set of information than is conventional, which enables speedier buffer parameter selection, including buffer placement. For example, in one embodiment of the invention, the automatic buffer parameter selection process may place buffers for an entire chip in a matter of a few minutes. In one alternative, buffer placement is solely responsive to capacitances set and calculated by the set terminal load process.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings,

TECHNICAL EFFECTS

As a result of the summarized invention, technically we have achieved a solution in which a process passes capacitance loading values backwards (opposite the direction of signal propagation), from receiving circuits back to driving circuits, regardless of their location in the design hierarchy. The advantage of this is that the solution is started from one end of the path, and propagates backwards to the other end. This approach removes the problems associated with tops-down or bottoms-up solutions where the driving circuit and receiving circuits) are both competing for the optimal buffer placement(s). Instead, this invention moves the uncertainty back to the driving circuit, where appropriate adjustments of driving circuit strength, wire layer, wire width, etc are selected to complete the solution.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which;

The detailed description explains the preferred embodiments of the invention, together with advantages and features, by way of example with reference to the drawings.

DETAILED DESCRIPTION OF THE INVENTION

Figure 1:
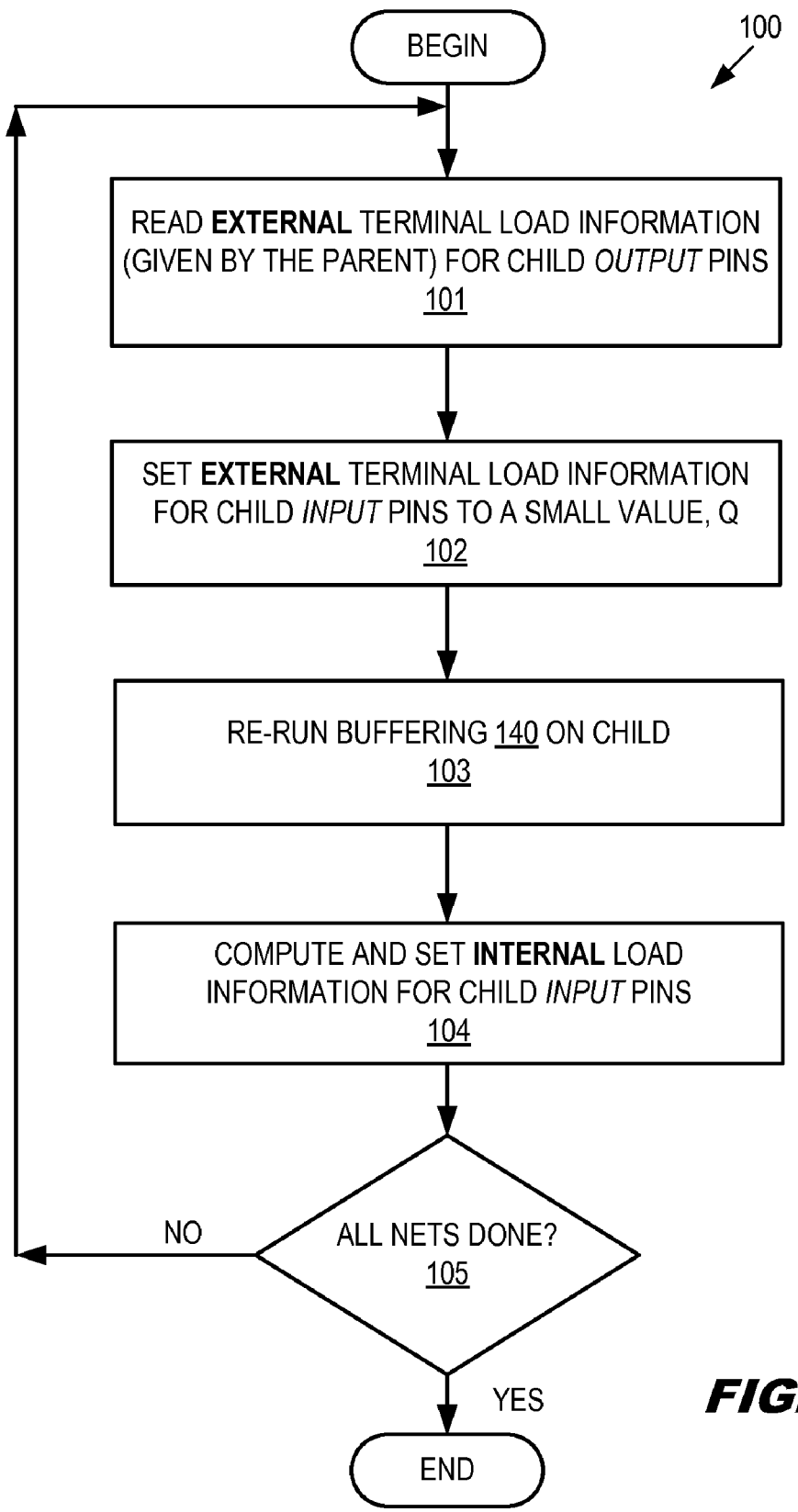
FIG. 1 illustrates aspects of one iteration of a process, at one level of device design hierarchy, according to an embodiment of the present invention.

In the context of a hierarchical design, having at least three levels of design hierarchy (parent, child, grandchild), FIG. 1 shows steps performed by a computer process 100 at the child level, according to an embodiment of the invention. That is, process 100 arises from execution of a computer program by a computer system, referred to herein as the "set terminal loads" or "SetTermLoads" program, which may be a subprogram of a larger program. Set terminal load process 100 may include subprocesses and may itself be a subproccss. It should be understood that reference herein to a process performing some function is intended to encompass a situation in which the process is a subproccss. Likewise, reference herein to a process performing some function is intended to encompass a situation in which a subprocess of the process performs the function.

First, at step 101, set terminal load process 100 obtains and responsively initializes external load properties, e.g., capacitance, for output pins on the child, which are, of course, driven by respective driving circuits, which maybe within the child. (The capacitance is broken out into 4 types—internal pin cap, internal wire cap, external pin cap, and external wire cap. The internal properties represent what's inside the Current level of hierarchy and the external properties represent what's outside of die pin in question (usually the parent side).) Set terminal load process 100 may do this in at least three different ways. (Process 100 may obtain and initially set external loads for different ones of the child output pins via different ones of the modes.)

More specifically, the child can either calculate the external loads based on the parent, or wait for the parent to hand down a file with load properties that the child can then read in, or receive the loads from user input.

Thus, in a first mode, referred to herein as a "Calculate from Parent Cell" mode, set terminal load process 100 calculates the external load for each output pin of the child cell responsive to the pin's parent and stores a record of this calculated load in a design database. (The calculating is according to conventional, well-known methods to meet objectives of required slew and delay target at the receiver pin, i.e., so that a transmitted signal arrives at a pin by a certain time and with an acceptable slew rate, according to given net topology, net lengths, wire widths, load count, etc.)

In this mode, the child is indeed calculating the load from the parent's circuitry or wire network. This is often not the preferred method Often the designers want the parent to do the calculations and pass that down in a file. (See second mode herein below).

In a Cadence design tool, for example, this record may be referred to as a parent cellView. (Herein, reference to a process "storing" something, should be understood to include storing data, which may be in the form of a file or a record or the like, and may include storing on a tangible, computer readable memory of the computer system on which the process is running or on such a memory of a connected device, which may be connected to the computer system via a network or otherwise.)

In a second mode, referred to herein as a "Get from file" mode, process 100 reads the external load for each output pin of the child cell from a file, i.e., a file for the child's parent, which may be supplied by a user, who may be a parent integrator, i.e., a designer who floor plans and routes (or integrates) the physical blocks in a unit.

In a third mode, referred to herein as a "Hardcode to fF value" mode, process 100 receives a fixed value for an output pin which the user enters via a user interface such as a menu on a computer display. Thus it is said that in this mode process 100 "hardcodes" the external load for the pin to that user entered value instead calculating or reading in the load on a pin. This mode is especially useful when the parent's netlist and/or buffer solution are unstable.

Since process 100 propagates the loading values backwards from the sink(s) of a signal, this step 101 allows the child to see the actual values closer to the sink(s) as such signals propagate through the parent level of hierarchy. Otherwise, the buffering tool conventionally would use load properties derived in a mishap manner, which could be correct, but would likely be based on old, i.e., not yet refreshed, unit data.

That is, a prior art arrangement was to always propagate load values bottoms-up (from grandchild to child to parent). A problem with that is that the levels of hierarchy are often designed at different paces, so the parent buffering had to wait for the grandchild or child to finish their buffering and load calculations. Alternatively, if the parent could not wait for buffering of it's child or the child could not wait for buffering of it's grandchild, and those lower level designs were not ready, then the process would assume default values, which were often mishap. This would lead to trouble, which would usually mean that design had to be changed later on once the true load values for child or grandchild were known. By contrast, SetTermLoads process 100 is used to ensure that properties are appropriately passed off to other units or levels of hierarchy in an orderly fashion ( from sink to source), according to an embodiment of the present invention.

In step 102 process 100 sets to an artificial, predetermined small value, Q, the external load properties of all input pins of the child, which are, of course, coupled to respective receiving circuits within the child. This is done in an embodiment of the invention by process 100 storing the predetermined load value Q as a property on the pin of the unit cell View ("cellView" being the Cadence design database) for each pin.

Then, a buffering process 140 is executed at step 103 of process 100, which places and sets drive strength of buffers on the child, i.e., between the child's receivers and their respective input pins. In addition, step 103 possibly also buffers between the child's drivers and their respective output pins and possibly also buffers nets of the child having no drivers or receivers, depending on predetermined rules that will be explained in connection with a specific example herein below. In this regard, the present description particularly concerns selection of which nets to buffer and the calculating, setting and communicating of loads (Zin and Zout) for each net according to the arrangement described herein, which is a precondition to placing and setting drive strength of buffers in the selected nets. Once the nets are selected for buffering and loads Zin and Zout for the nets are calculated or otherwise determined, the present invention contemplates that the placing and setting of drive strength of buffers in the selected nets is done according to conventional, well-known methods responsive to the length of the net, the width of the wire used by that net, the number of loads needed to be driven, as well as the Zin of each load (or pin) and the Zout of the driving circuit (or pin).

In executing step 103, buffering process 140 reads the load values Q on the child's input pins, which indicate to process 140 a buffer exists very close to each input pin. Therefore, at step 103 buffering process 140 does not introduce buffers right at the child input pins, which buffer process 140 might otherwise do to prevent slew fails. Preventing buffering process 140 from placing buffers at the child input pins is useful, since these buffers might ultimately be unnecessary.

Once buffering process 140 completes its buffering in step 103, then, at step 104, set terminal load process 100 computes new internal load properties for the child, which may be due to the addition of buffers, and sets and stores than in the design database for all input pins of the child. At this point, other entities have access via databases to load information for all signals that drive into this child.

It should be appreciated from the foregoing that process 100 enables users to annotate their terminals with capacitance load properties. There are two sets of properties that can be annotated—internal capacitances and external capacitances. Internal capacitances are the loads that are seen by a parent on a child's terminals. They are most important on a child's input pins. External capacitances are the properties that a child sees on its terminals reflecting the parents loads. These are most important on a child's output pins.

The overall process of communicating the loads back and forth between parent and child is critical for accurate and balanced buffer insertion. The parent needs to know what's going on in the child (as for as the net topology) and vice versa. In order to prevent any oscillation in hierarchical buffering (the circular feedback of load info between parent and child), one set of load properties must be anchored. In the typical case, logic of process 100 includes a step in which the internal capacitances of the child's output pins is deemed to be close to 0.0fF (value Q from above). This effectively implies that there is a buffer very close to the child's output pin.

Figure 2A:
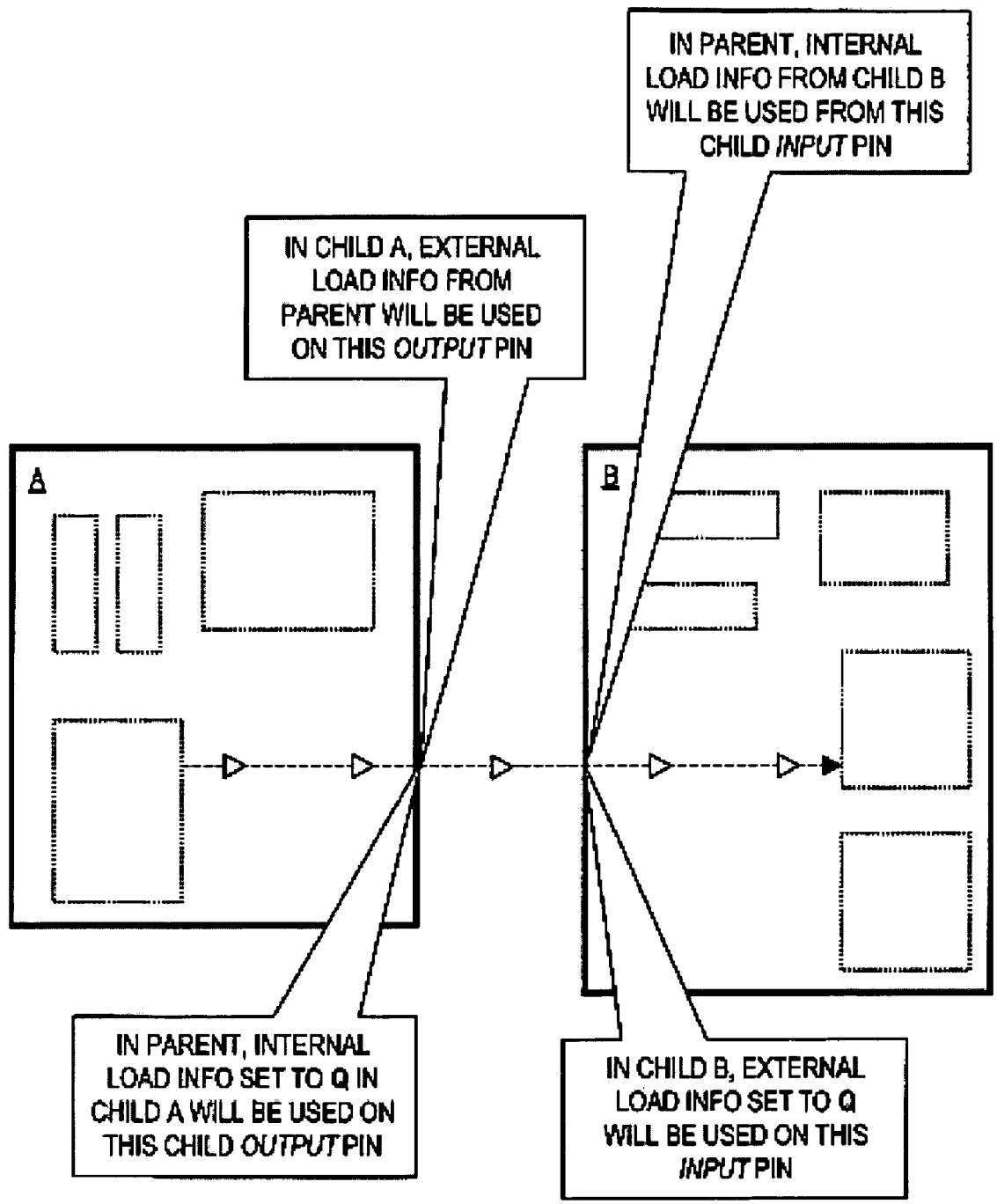
FIG. 2A illustrates one example of three entities in a device having a design hierarchy, wherein a signal connection is propagated through all three entities of the device, according to an embodiment of the present invention.

Referring now to FIG. 2A, example is illustrated of three entities in a device having a design hierarchy, wherein a signal connection is propagated through all three entities of the device, according to an embodiment of the present invention. More specifically regarding the three entities, child entities A and B are shown placed on a parent entity. The example is simple in order to facilitate understanding of particular issues.

The parent first runs buffering and creates a file containing external loads seen by the terminals of its children A and B. This file is read in by process 100 (FIG. 1) when running for the children and sets external load information for the children's output terminals. In the illustrated instance, this applies to child A, since no output terminal is shown for child B. This is followed by a buffering run for the children. That is, next, process 100 computers and sets internal Load information for the children's output terminals (i.e., child A in this example). Also, process 100 sets the internal load on the children's input terminals to the value Q (i.e., something close to 0 pf). In the illustrated instance, this applies to child B, since no input terminal is shown for child A. This is an anchoring point of process 100 to prevent oscillation of buffer solutions.

Finally, if another iteration of the process 100 is needed, which depends on the particular configuration, process 100 creates an file for the external loads of the children, which would be for use by the parent in this simple example.

In general, the whole process 100 is repeated as many times as necessary to get down to a stable buffering solution. It should be understood that in general a child typically has both drivers and receivers, and process 100 may execute a plurality of iterations for a parent, a plurality of iterations for children, a plurality of iterations for grandchildren, etc. The number of iterations for each entity and each level of entities, depends one pass for drivers of the child and another pass for receivers of the child. Then process 100 does the same thing with the grandchild and grandparent and so on throughout the hierarchy.

Referring now to FIGS. 2B-2G, circuitry 200 is illustrated according to an embodiment of the invention, in which various ones of logical entities 230, 232, 234, 236 and 238 have drivers 240D1-240D4, with respective drivers 240D1-240D4 being coupled to respective receivers 240R1-240R4. (The drivers and receivers are, of course, circuitry. It should be understood that this arrangement is a very simple one, i.e., having a relatively few drivers and receivers connected in a simple way. This simple arrangement is presented here to clearly illustrate principles of the invention. However, the invention is applicable to circuitry having immense numbers of drivers and receivers coupled in a more complicated fashion.)

In FIGS. 2B-2G the same arrangement of 240D1-240D4 and receivers 240R1-240R4 is repeatedly illustrated in a sequence of buffering passes performed by process 100 of FIG. 1, according to an embodiment of the invention, in which the sequence begins with parent 230 entity and, in particular, with receiver 240D1 therein. The FIG's illustrate how process 100 progresses in a sequence of buffering passes through the hierarchy from one entity to a next, always buffering the current pass's entity according to predetermined, receiver-centric buffering rules. According to these rules, process 100 buffers the current pass's entity with regard to its receivers, and also buffers the current pass's entity with regard to any net on the current entity that is directly coupled to a net of an adjacent entity that has been buffered already in a previous pass, provided that the previously buffered net is itself coupled to a receiver on its own net or at least coupled to a receiver on some other previously buffered net via nets that have all, themselves, been buffered in previous passes.

In FIGS. 2B-2G and the accompanying description, Zin and Zout refer to loads at pins coupled to drivers or receivers where the pins are near entity boundaries, not loads at the drivers and receivers themselves.

Figure 2B:
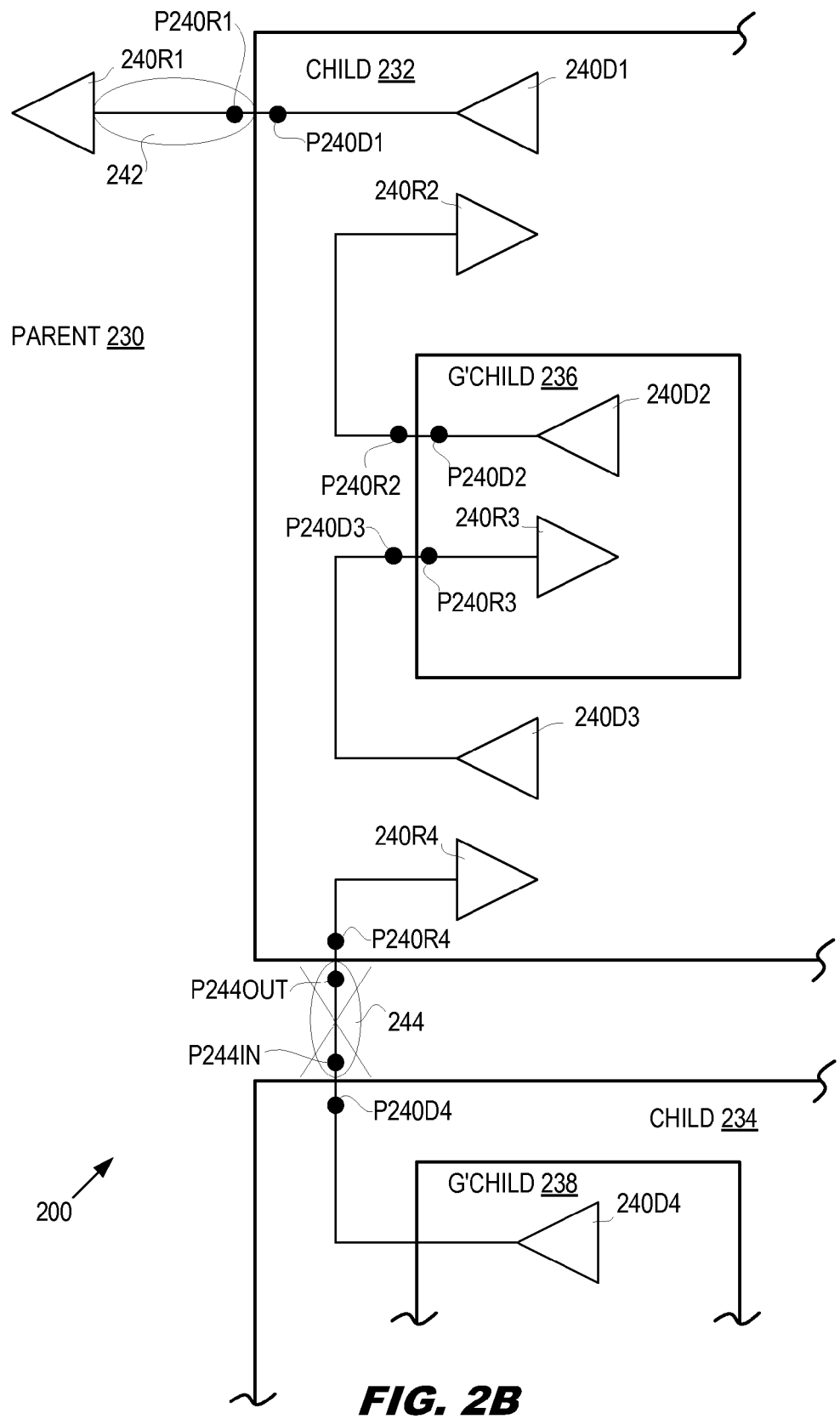
FIGS. 2B-2G illustrate application of the process of FIG. 1 fn several iterations for respective levels of device hierarchy for a particular device, according to an embodiment of the present invention.

FIG. 2B Illustrates an initial pass in the buffering sequence performed by process 100, which begins with parent 230 in the illustrated instance. It is not necessary in all cases for process 100 to begin the sequence with parent 230 or any particular other one of the entities. While it may be advantageous to proceed in a particular sequence for reasons of circuitry 200 network structure or for reasons of administrative convenience, process 100 may, nevertheless, proceed in essentially any sequence among the entities, as long as in each pass (i.e., iteration) of the sequence, process 100 buffers each current pass's entity according to the receiver-centric buffering rules as stated above.

Note that in the illustrated embodiment of the invention, process 100 has to perform buffering passes on at least some entities more than once in order to complete the buffering of all circuitry those entities, due to the conditions imposed by the receiver-centric buffering rules. This will be common in most any circuitry arrangement. It would not be necessary, for example, if buffering went from parent to child to grandchild, etc, provided that the parent had only receivers coupled to drivers of the children, and the children had only receivers coupled to drivers of the grandchildren, etc. This would, however, be an unusual circuitry arrangement.

In one step corresponding to 102 in FIG. 1, process 100 temporarily fixes Zout on input pin P240R1 for receiver 240R1 to a predetermined value Q that is very nearly zero farads, e.g., 1 Picofarad in the present embodiment of the invention. In the particular parent 230 of the illustrated embodiment, net 244 is coupled directly to 240R4 of child 232. Process 100 skips net 244 on parent 230 in the current buffering pass, because receiver 240R4 is the only receiver to which net 244 is coupled, and receiver 240R4 is not yet buffered on child 232.

Next, process 100, in a step corresponding to 103 in FIG. 1, places buffets for net 242 of parent 230, since net 242 is directly coupled to receiver 240R1 and since receiver 240R1 is located on parent 230. Process 100 places the buffers according to its calculations, which are responsive to the Zin of net 242 that was temporarily fixed according to the above previously described step, plus also responsive to layout and timing requirements that are according to conventional, well known buffering calculations.

Next, process 100, in a step corresponding to 104 in FIG. 1, calculates a new Zin for receiver 240R1, which takes into account the newly added buffer or buffers of net 242, and makes this load available (i.e., as a property of input pin P240R1 for receiver 240R1 in database 337 (FIG. 3)) for use by child 232 in a subsequent pass.

Figure 2C:
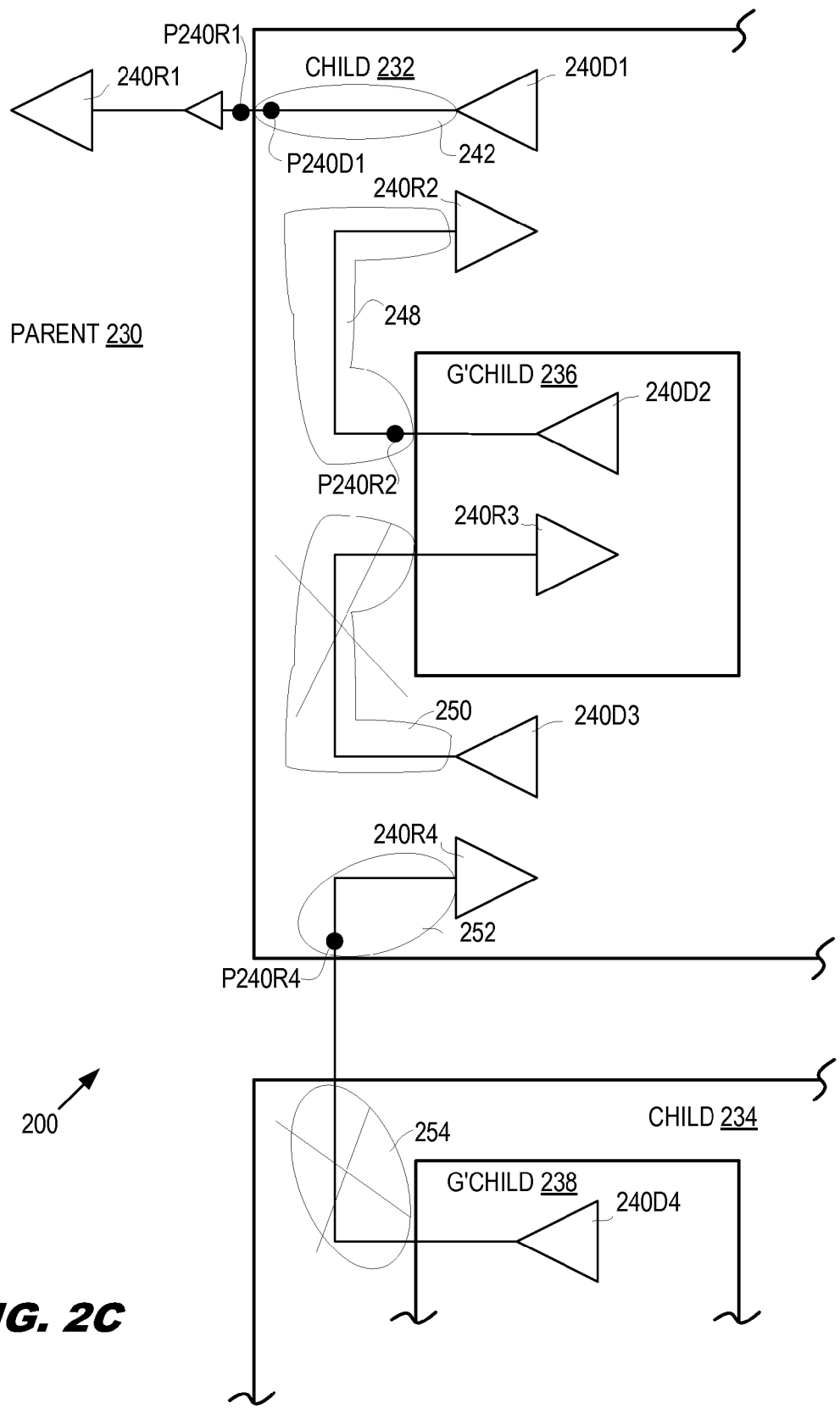

Referring now to FIG. 2C, a next iteration in the buffering sequence performed by process 100 is illustrated, which now deals with children 232 and 234 in the illustrated instance. In a one step of this iteration, which corresponds to 102 in FIG. 1, process 100 fixes Zout=Q on child 232 input pin P240R2 of receiver 240R2 and for child 234 input pin P240R4 of receiver 240R4.

In a one step of this iteration, which corresponds to 101 in FIG. 1, process 100 calculates Zout for 240D1, This load for 240D1 is mostly the Zin load for input pin P240R1 associated with 240R1 on parent 230, which process 100 reads from database 337 (FIG. 3), plus a little load due to the conductive trace between pin P240R1 and P240D1, which process 100 calculates and combines with the Zin load from input pin P240R1.

In this iteration, calculation steps 101 and 103 (FIG. 1) are skipped for net 250 of 240D3 because the only receiver to which net 250 is coupled is receiver 240R3 on grandchild 236, which is not yet buffered. Likewise, steps 101-103 (FIG, 1) are skipped for net 254 on child 236 because the only receiver to which net 254 is coupled is receiver 240R4 on child 232, which is not yet buffered.

Next, process 100, in a step corresponding to 103 in FIG. 1, places a buffer or buffers for net 246 of child 232, since net 246 is directly coupled to receiver 240R1 of parent 230, which is already buffered on parent 230. Also, as part of this same step, process 100 places a buffer or buffers for net 248 of child 232, since net 248 is directly coupled to receiver 240R2, which is on child 232. Also, as part of this same step, process 100 places a buffer or buffers for net 252 of child 232, since net 252 is directly coupled to receiver 240R4, which is on child 232.

Figure 2D:
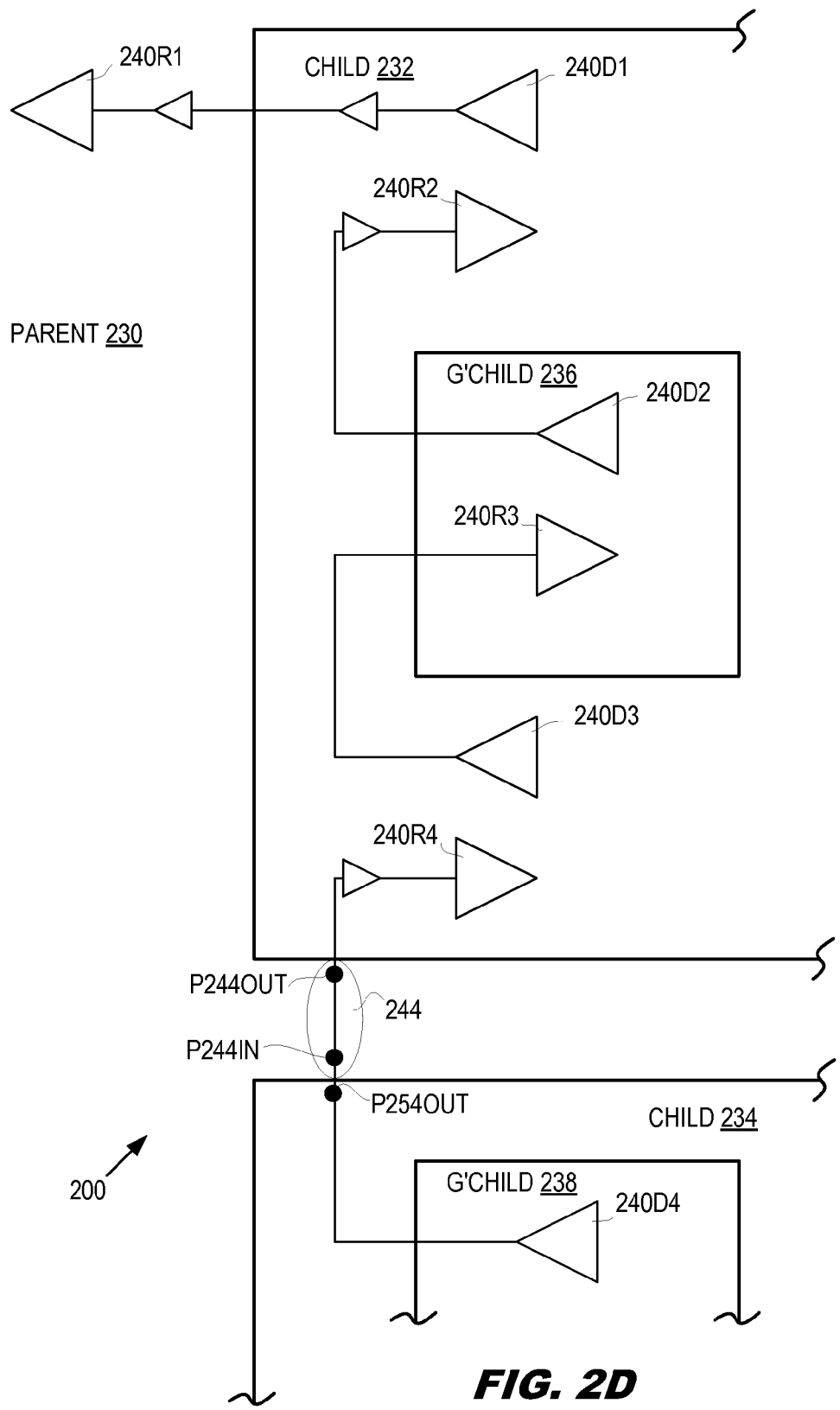

Next, in step 104 (FIG. 1), process 100 calculates a new Zin for 240R2 and 240R4, making these available on in database 337 (FIG. 3) as properties of input pins P240R2 and P240R4, respectively, for use by other entities in subsequent passes, Referring now to FIG. 2D, a next iteration in the buffering sequence performed by process 100 is illustrated, which returns to parent 230 to deal with the only remaining unbuffered net, i.e., net 244, since this net is directly coupled to a receiver on child 232 whose net on child 232 has now been buffered.

Thus, process 100, in step 101 (FIG. 1), calculates Zout for net 244 looking toward 240R4 from output pin P244OUT. The Zout load for P244OUT is mostly the Zin load for input pin P240R4, which process 100 reads from database 337 (FIG, 3), plus a little load due to the conductive trace between pin P240R4 and P244OUT, which process 100 calculates and combines with the Z in load from input pin P240R4.

Also, in a step 102 (FIG. 1), process 100 fixes Zout=Q for pin P244IN looking toward 240D4, which is on grandchild 238. Then process 100 performs a buffering step 103 (FIG. 1) for net 244 and then calculates new Zin for net 244 at pin P244IN, in step 104 (FIG. 1), and makes it available in database 337 (FIG. 3) for child 234 and grandchild 238 in subsequent passes.

Figure 2E:
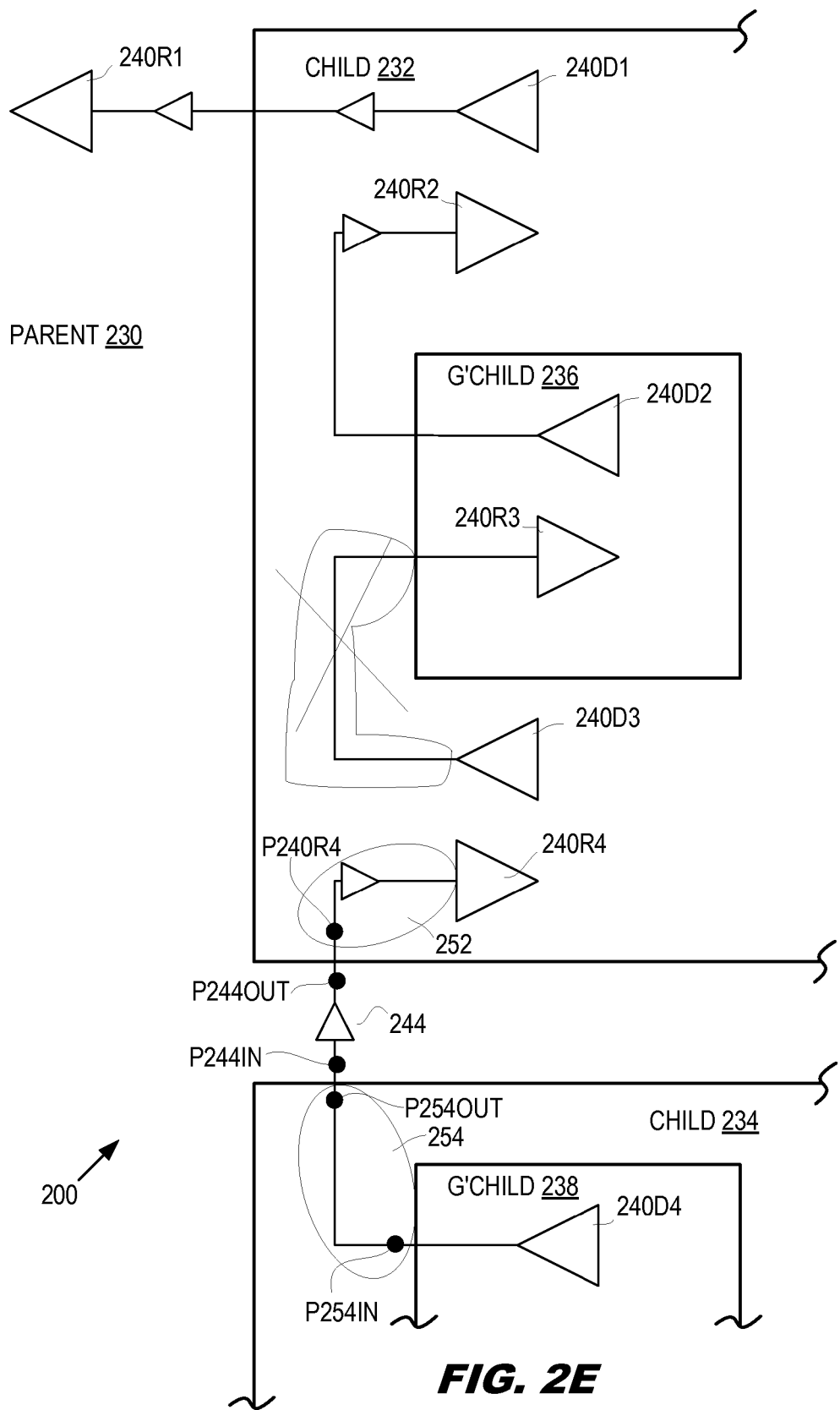

Referring now to FIG. 2E, a next iteration in the buffering sequence performed by process 100 is illustrated, which returns to children 232 and 234 to deal with one of the remaining unbuffered nets. Specifically, net 254 is now dealt with, since this net is coupled to receiver 240R4 on child 232 whose net 252 on child 232 has now been buffered and whose sole other intervening net 244, which is on parent 230, has also now been buffered. In child 232, however, unbuffered net 250 is skipped in this pass, because the net of the only receiver to which it is connected, receiver 240R3 on grandchild 236, is still not buffered.

In one step 101 (FIG. 1), process 100 calculates Zout for child 234 net 254 looking toward receiver 240R4. This Zout is mostly due to the Zin load for input pin P244IN associated with net 244 on parent 230, which process 100 reads from database 337 (FIG. 3), plus a little load added by the conductive trace between pin P254OUT and P244IN, which process 100 calculates and combines with the Zin load from pin P244IN.

In one step 102 (FIG. 1), process 100 temporarily fixes Zout=Q for child 234 net 254, i.e., the load on pin P254IN looking toward D4.

Next, in step 103 (FIG. 1), process 100 buffers net 254 responsive to the Zin and Zout of net 254 that was determined according to the previously described steps, plus also responsive to layout and timing requirements according to well known buffering calculations.

Next, in step 104 (FIG. 1), process 100 calculates a new Zin for child 234 net 254 looking from pin P254IN near grandchild 238, and makes this load available in database 337 (FIG. 3) for grandchild 238 in a next pass.

Figure 2F:
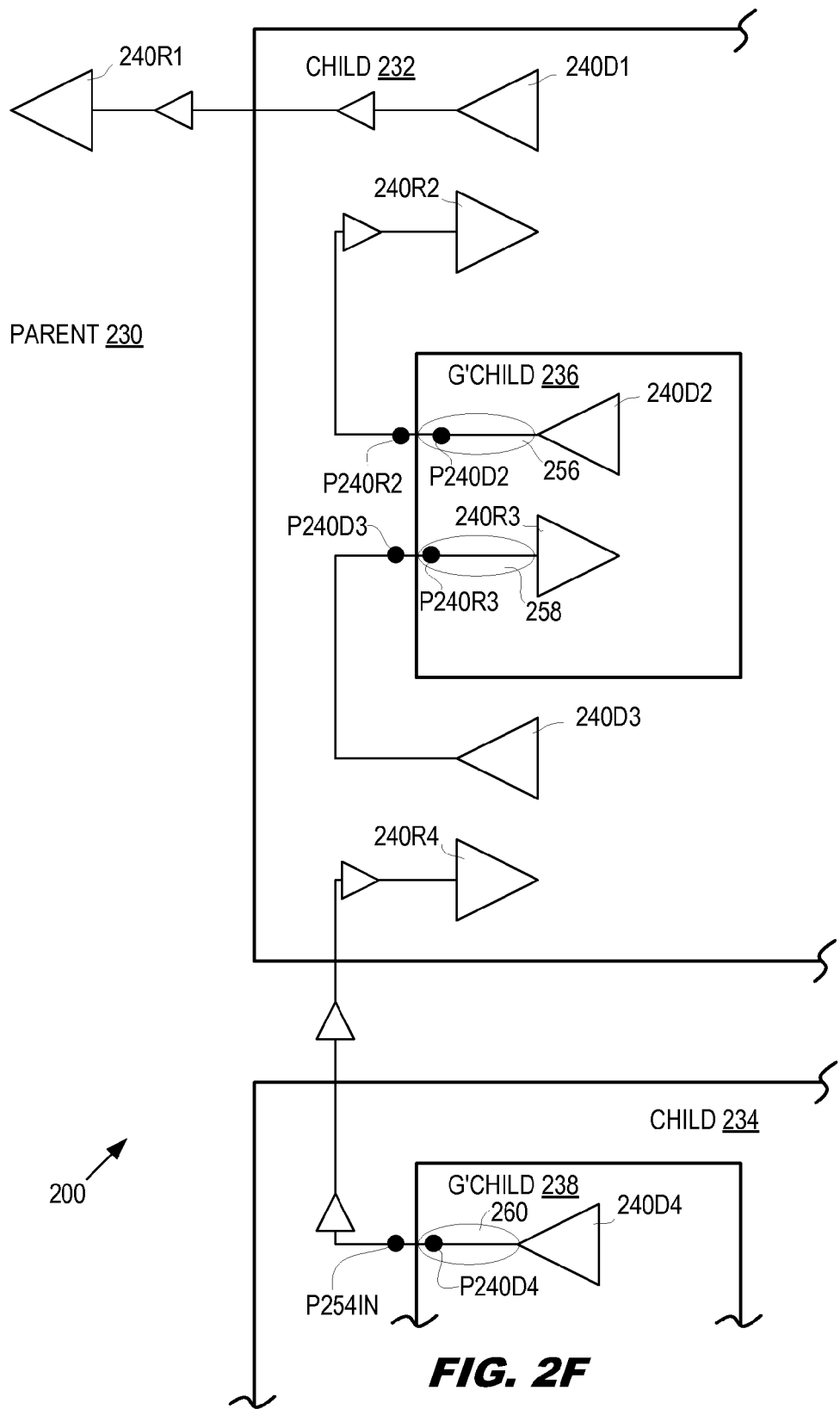

Referring now to FIG. 2F, a next iteration in the buffering sequence performed by process 100 is illustrated, which deals with buffering grandchildren 236 and 238. In accordance with the same steps as described above, process 100 buffers nets 256 and 258 on grandchild 236 and net 260 on grandchild 238 in this pass.

Figure 2G:
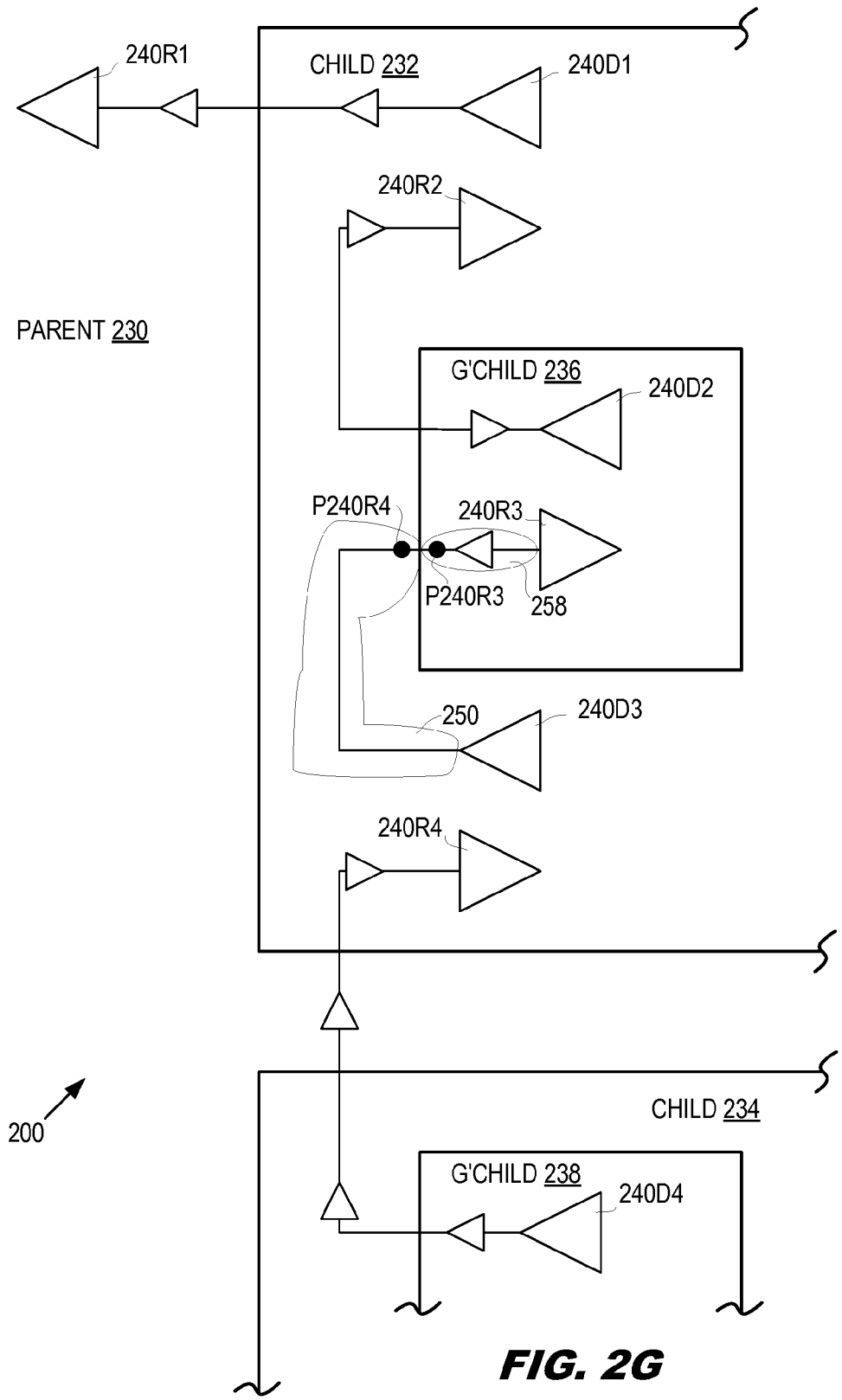

Referring now to FIG. 2G, a next iteration in the buffering sequence performed by process 100 is illustrated, which deals with buffering the last unbuffered net on the portion of the chip that is illustrated in the example, which is net 250 on child 232 and is directly coupled to receiver 240R3 on grandchild 236. As previously described, this includes process 100 computing Zout for net 250, which includes getting the Zin for net 258 that was computed in the last pass for grandchild 236.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps maybe added, deleted or modified. All of these variations are considered a part of the claimed invention.

Computer Program Product

The present invention, aspects of which are shown in the above FIG's, may be distributed in the form of instructions, which may include data structures and may be referred to as a "computer program," "program," "program code," "software," "computer software," "resident software," "firmware," "microcode," etc. Stored on a computer-readable storage medium, such instructions and storage medium may be referred to as a "computer program product," "program product," etc.

The computer program product may be accessible from a computer-readable storage medium providing program code for use by or in connection with a computer or any instruction execution system. The present invention applies equally regardless of the particular type of media actually used to carry out the distribution. The instructions are read from the computer-readable storage medium by an electronic, magnetic, optical, electromagnetic or infrared signal. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. The instructions may also be distributed by digital and analog communications links, referred to as "transmission media."

Computer System

A data processing system suitable for storing and/or executing program code includes at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 3:
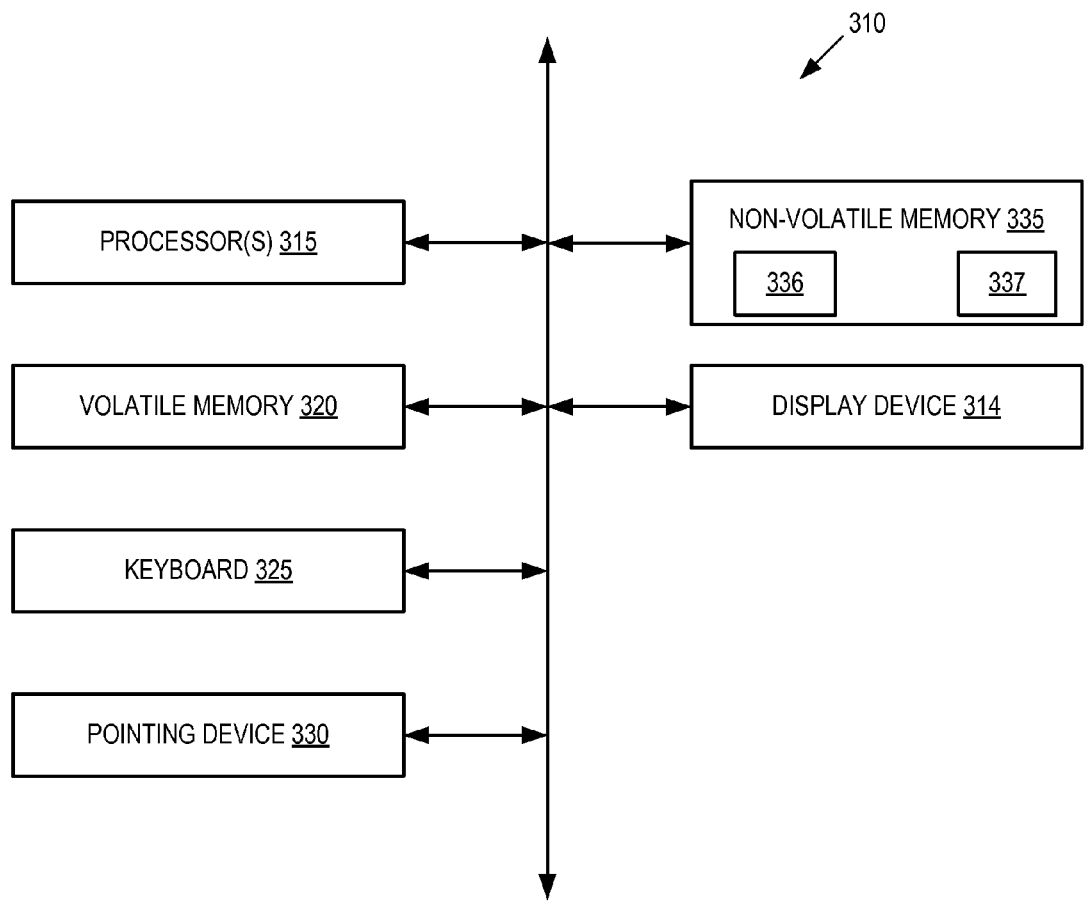
FIG. 3 illustrates one example of a computer system in which the process of FIG. 1 is implemented, according to an embodiment of the present invention.

Referring now to FIG. 3, a computer system 310 is illustrated, which may take a variety of forms, including a personal computer system, mainframe computer system, workstation, server, etc That is, it should be understood that the term "computer system" is intended to encompass any device having a processor that executes instructions from a memory medium. In the illustrated system embodiment, system 310 includes one or more processors 315, a keyboard 325, a pointing device 330, and tangible, computer-readable storage media, including volatile 320, and nonvolatile memory 335, e.g., ROM, hard disk, floppy disk, CD-ROM, and DVD, and display device 314.

Memory 335 of system 310 stores computer programs 336 (also known as "software programs"), wherein programs 336 include instructions that are executable by one or more processors 315 to implement various embodiments of a method in accordance with the present invention. Memory 335 of system 310 also has database 337 stored thereon that provides circuit structures, logical entity properties including physical locations, etc. Programs 336 include instructions for implementing the process 100 of FIG. 1, for example, as well as other processes describe herein.

Those of ordinary skill in the art will appreciate that the hardware in FIG. 3 may vary depending on the implementation. For example, other peripheral devices may be used in addition to or in place of the hardware depicted in FIG. 3. The depicted example is not meant to imply architectural limitations with respect to the present invention. Various embodiments of system 310 implement one or more software programs 336 and data 337 in various ways, including procedure-based techniques, component-based techniques, and/or object-oriented techniques, among others. Specific examples include XML, C, C++ objects, Java and commercial class libraries.

General Remarks

The terms "circuitry" and "memory," and the like are used herein. It should be understood that these terms refer to circuitry that is part of the design for an integrated circuit chip such as device 200 FIGS. 2B-2G. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with Leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product The end product can be any product that includes integrated circuit chips, ranging from toys and other low-end applications to advanced computer products having a display, a keyboard or other input device, and a central processor.

To reiterate, die embodiments were chosen and described in order to best explain the principles of the invention, the practical application, and to enable others of ordinary skill in the art to understand the invention. Various other embodiments having various modifications may be suited to a particular use contemplated, but may be within the scope of the present invention.

Unless clearly and explicitly stated, the claims that follow are not intended to imply any particular sequence of actions. The inclusion of labels, such as a), b), c) etc, for portions of the claims does not, by itself, imply any particular sequence, but rather is merely to facilitate reference to the portions.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for propagating load information through a hierarchical, integrated circuit design:
    establishing load information starting at receiving circuits for a signal, wherein the load information is limited to internal pin capacitance, internal wire capacitance, external pin capacitance, and external wire capacitance; and
    propagating the load information without propagating delay times between input and output pins, wherein the propagating includes a computer system propagating the load information from the receiver circuits by traversing through any number and combination of hierarchal levels to the driving circuit.

2. The method according to claim 1, wherein the propagating includes:
    reading external capacitive load properties for output pins of a given level of design hierarchy, wherein the external capacitive load properties are read from a next higher level in the design hierarchy.

3. The method according to claim 1, wherein the propagating includes:
    setting external capacitive load properties for input pins of a given level of design hierarchy.

4. The method according to claim 1, wherein the propagating includes:
    computing and setting internal capacitive load properties for input pins of a given level of design hierarchy.

5. The method according to claim 1, wherein the propagating includes:
    setting capacitive load properties for output pins of a given level of design hierarchy.

6. The method according to claim 1, wherein the propagating includes:
    computing and setting the capacitive load properties for the output pins of all children entities at a given level of design hierarchy.

7. A method in an integrated circuit ("IC") device design process,
    wherein the IC device has circuit entities, wherein design production processes executed by a computer system produce representations of the respective entities,
    wherein the entities include drivers and receivers, the drivers being coupled via networks of the device to corresponding receivers, and wherein ones of the drivers and corresponding receivers are in non-adjacent entities, the method comprising:
    loading selected input and output pins of first, second, and third ones of the entities by a terminal loading computer process prior to respectively buffering nets coupled to the input and output pins of the first, second, and third entities;
    executing a buffering computer process for placing buffers on selected nets coupled to the input and output pins of the respective first, second, and third entities, wherein the executing of the buffering computer process for each of the first, second, and third entities includes executing the buffering computer process in at least first, second, and third successive iterations, wherein buffering is performed for selected nets of one of the entities in a current iteration, the buffering in such a current iteration being limited to i) buffering nets on the current iteration entity for receivers on the current iteration entity and ii) buffering nets on the current iteration entity directly coupled to respective nets of an immediately adjacent entity that has been buffered already in a preceding one of iterations, wherein such a net buffered in ii) is buffered only if the already buffered net is coupled to a receiver on its own net or a receiver on some other already buffered net via nets that have all been buffered via one or more of the preceding iterations.

8. The method of claim 7, wherein the entities have hierarchical interrelationships including hierarchical levels, ones of the entities being at higher hierarchical levels respective to other ones of the entities, and wherein the loading comprises:
    reading external load properties for output pins of a given level of design hierarchy, wherein the external load properties are read from a next higher level in the design hierarchy.

9. The method according to claim 7, wherein the loading comprises:
    setting external load properties for input pins of a given level of design hierarchy.

10. The method according to claim 7, wherein the loading includes:
    computing and setting internal load properties for input pins of a given level of design hierarchy.

11. The method according to claim 7, wherein the loading includes:

setting load properties for output pins of a given level of design hierarchy.

12. The method according to claim 7, wherein the loading-includes:
computing and setting the load properties for the output pins of all children entities at a given level of design hierarchy.

13. The method according to claim 7, wherein the loading-includes:
repeating at least one of the iterations for one of the first, second, or third entities.

14. The method according to claim 7, wherein the loads include capacitances.

15. The method of claim 7, wherein the entities have hierarchical interrelationships including hierarchical levels, ones of the entities being at higher hierarchical levels respective to other ones of the entities, and wherein the loading comprises:
computing external load properties for output pins of a given level of design hierarchy, wherein the external load properties are computed from a next higher level in the design hierarchy.

16. The method according to claim 15, comprising:
repeating at least one of the iterations for one of the first, second, or third entities.

17. The method according to claim 15, wherein the loads include capacitances.

18. A method in an integrated circuit ("IC") device design process, wherein the IC device has circuit entities, wherein design production processes executed by a computer system produce representations of the respective entities, wherein the entities include drivers and receivers, the drivers being coupled via networks of the device to corresponding receivers, and wherein ones of the drivers and corresponding receivers are in non-adjacent entities, the method comprising:
a) storing, in a computer readable memory by a loading computer process, first predetermined values for first entity receivers, wherein the first entity receivers are coupled via corresponding first entity receiver networks to corresponding first entity input pins and the first predetermined values indicate artificial loads external to the input pins of the first entity receivers;
b) placing buffers on the first entity receiver networks by a buffering computer process responsive to properties of the networks and responsive to the artificial, external loads of the input pins for the first entity receivers;
c) computing, by the loading computer process after the buffers are placed, loads internal to the first entity for the respective first entity input pins;
d) storing, in a computer readable memory by the loading computer process, second predetermined values for receivers of a second entity, the second entity being adjacent to the first entity, wherein the second entity receivers are coupled via corresponding second entity receiver networks to corresponding second entity input pins, the second predetermined values indicating artificial loads external to the input pins of the second entity receivers;
e) placing buffers on the second entity receiver networks by the buffering computer process responsive to properties of the second entity receiver networks and responsive to the artificial, external loads of the input pins for the second entity receivers, and wherein the second entity has first certain networks coupled to corresponding second entity output pins and coupled to respective ones of the first entity receiver networks;
f) placing buffers on the first certain networks by the buffering computer process responsive to properties of the second entity first certain networks and responsive to the internal loads for the respective first entity input pins computed in c);
g) computing, by the loading computer process after the buffers are placed on the first certain networks, loads internal to the second entity for the respective second entity input pins;
h) storing, in a computer readable memory by the loading computer process, third predetermined values for receivers of a third entity, the third entity being adjacent to the second entity and non-adjacent to the first entity, wherein the third entity receivers are coupled via corresponding third entity receiver networks to corresponding third entity input pins, the third predetermined values indicating artificial loads external to the input pins of the third entity receivers;
i) placing buffers on the third entity receiver networks by the buffering computer process responsive to properties of the third entity receiver networks and responsive to the artificial, external loads of the input pins for the third entity receivers, and wherein the third entity has second certain networks coupled to corresponding third entity output pins and coupled to the second entity first certain networks via ones of the third entity output pins; and
j) placing buffers on the second certain networks by the buffering computer process responsive to properties of the third entity second certain networks and responsive to the internal loads of the input pins for the second entity first certain networks computed in g).

19. The method of 18, wherein the entities have hierarchical interrelationships including hierarchical levels, ones of the entities being at higher hierarchical levels respective to other ones of the entities.

20. The method of claim 19, wherein the second entity is at a lower hierarchical level than the first entity and at a higher hierarchical level than the third entity.

* * * * *